(12) United States Patent
Tsumura et al.

(10) Patent No.: US 8,754,532 B2
(45) Date of Patent: Jun. 17, 2014

(54) SEMICONDUCTOR DEVICE AND MANUFACTURING METHOD THEREOF

(71) Applicant: Kabushiki Kaisha Toshiba, Tokyo (JP)

(72) Inventors: Kazumichi Tsumura, Ooita (JP); Kazuyuki Higashi, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/776,396

(22) Filed: Feb. 25, 2013

(65) Prior Publication Data
US 2014/0021631 A1 Jan. 23, 2014

(30) Foreign Application Priority Data

Jul. 20, 2012 (JP) ................................. 2012-161613

(51) Int. Cl.
H01L 23/48 (2006.01)
(52) U.S. Cl.
USPC ............ 257/774; 257/E23.011; 257/E21.597; 438/667
(58) Field of Classification Search
USPC ............ 257/774, E23.011, E21.597; 438/667
See application file for complete search history.

(56) References Cited

U.S. PATENT DOCUMENTS

| 2006/0051949 | A1* | 3/2006 | Nemoto | 438/597 |
| 2012/0295415 | A1* | 11/2012 | Ono | 438/455 |
| 2013/0122706 | A1* | 5/2013 | Okuchi et al. | 438/694 |
| 2013/0161795 | A1* | 6/2013 | Owada | 257/620 |

FOREIGN PATENT DOCUMENTS

| JP | 2008-193117 | 8/2008 |
| JP | 2011-216763 | 10/2011 |
| JP | 2011-258826 | 12/2011 |

* cited by examiner

Primary Examiner — Trung Q Dang
(74) Attorney, Agent, or Firm — Patterson & Sheridan, L.L.P.

(57) ABSTRACT

A semiconductor device includes a supporting substrate; a semiconductor substrate that includes a first surface in which at least one layer is formed and a second surface that is positioned on an opposite side to the first surface, and is pasted to a surface of the supporting substrate with adhesive such that the first surface faces the supporting substrate side; a protective film that is formed on the second surface of the semiconductor substrate and on a surface of the adhesive extending outwardly from a region between the supporting substrate and the semiconductor substrate, and including a perimeter part that is positioned outside a perimeter part of the adhesive, and positioned inside a perimeter part of the supporting substrate; and an electrode material that is formed so as to be embedded in a penetration hole that penetrates the protective film and the semiconductor substrate.

20 Claims, 6 Drawing Sheets

SEMICONDUCTOR DEVICE AND MANUFACTURING METHOD THEREOF

CROSS-REFERENCE TO RELATED APPLICATION(S)

This application is based upon and claims the benefit of priority from Japanese Patent Application No. 2012-161613, filed on Jul. 20, 2012, the entire contents of which are incorporated herein by reference.

FIELD

Embodiments of the present application relate to a semiconductor device and a manufacturing method thereof.

BACKGROUND

In recent years, a structure in which a penetration electrode, called a through silicon via (TSV) electrode, which is formed in a semiconductor substrate and extend, through the silicon underlying the device, has been proposed. A TSV electrode is formed, for example as follows. First, after a layer that includes a transistor and wiring is formed on a first surface side of a semiconductor substrate, the semiconductor substrate is pasted to a surface of a supporting substrate with adhesive such that the first surface of the semiconductor substrate faces a supporting substrate side. Next, the semiconductor substrate is ground from a second surface side to thin the semiconductor substrate. Next, a protective film that covers the second surface of the semiconductor substrate and any exposed adhesive is formed on the substrate. Next, a resist film is formed on the protective film, and patterned. Thereafter a penetration hole (TSV hole) that penetrates the protective film and the semiconductor substrate is formed by etching using the resist film as a mask. Next, an electrode material is embedded in the penetration hole and a TSV electrode is formed. However, it has been found that the semiconductor substrate may be easily separated from the supporting substrate during processing to form the TSV, resulting in damage to, or complete loss of, the substrate and the devices formed thereon.

DETAILED DESCRIPTION

A semiconductor device, in which it is suppressed that a semiconductor substrate pasted to a supporting substrate with adhesive separates from the supporting substrate, and a manufacturing method thereof are provided. Specifically, one semiconductor device disclosed in the application includes a supporting substrate; a semiconductor substrate that includes a first surface in which at least one layer is formed and a second surface that is positioned on an opposite side to the first surface, and the device or first side of the semiconductor substrate is pasted to a surface of the supporting substrate with adhesive such that the first surface faces the supporting substrate; a protective film that is formed on the second surface of the semiconductor substrate and on a surface of any exposed adhesive extending outwardly from a region between the supporting substrate and the semiconductor substrate, a perimeter part that is positioned outside a perimeter or furthest outward extent part of the adhesive, and positioned inside a perimeter part of the supporting substrate; and an electrode material that is formed so as to be embedded in a penetration hole that penetrates the protective film and the semiconductor substrate.

Hereinafter, embodiments of the present application are explained with reference to the drawings.

First Embodiment

FIG. 1A through FIG. 3C are cross-sectional views illustrating a manufacture method of a semiconductor device according to the first embodiment. In the present method, a TSV electrode is formed by Via Last/Backside Via TSV Process.

Figure 1A:
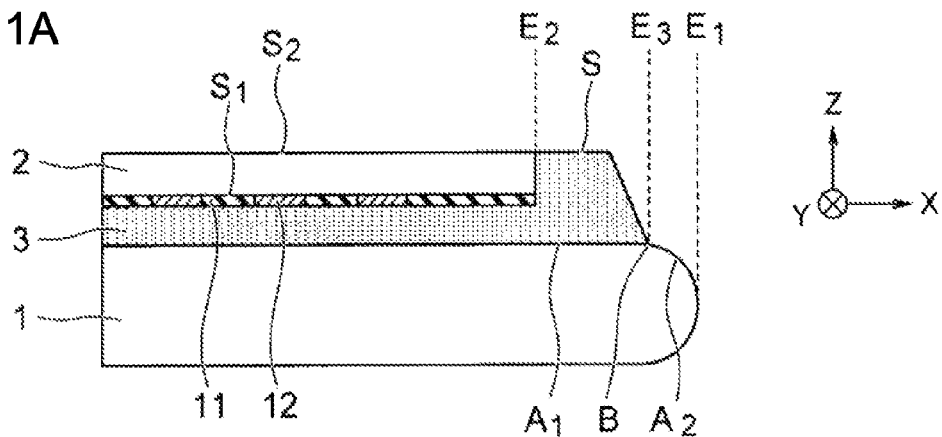
FIGS. 1A through 1C are cross-sectional views illustrating a manufacturing method of a semiconductor device according to a first embodiment.
Figure 1B:
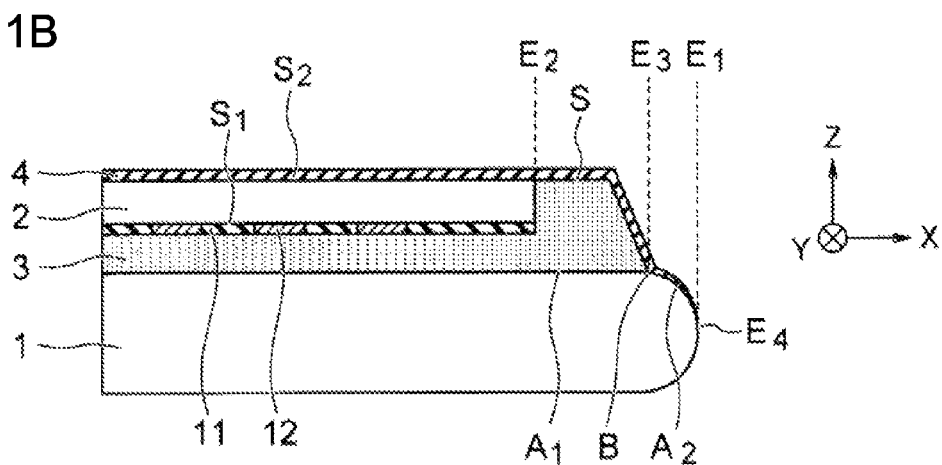
Figure 1C:
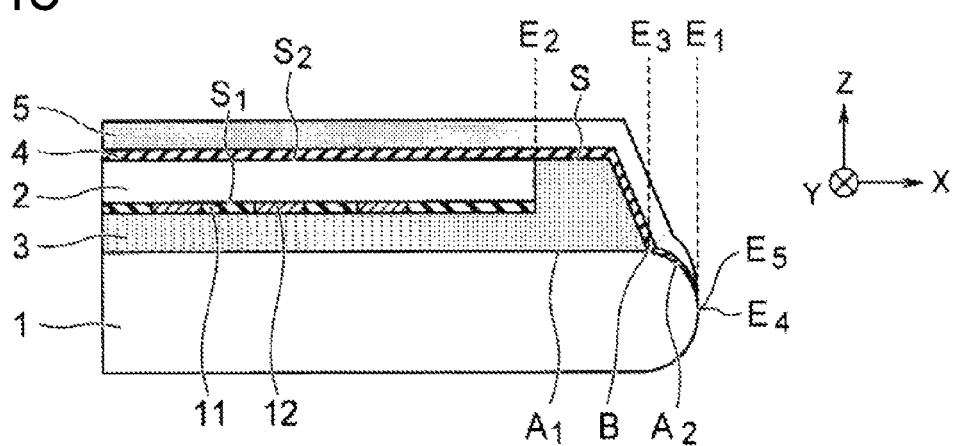

(1) Steps of FIG. 1A through FIG. 1C

In this method, first, as illustrated in FIG. 1A, a semiconductor substrate 2 is adhered to a surface of a supporting substrate 1 with adhesive 3.

The supporting substrate 1 is a silicon substrate or a glass substrate, for example. A mark $E_1$ indicates a position of the edge or perimeter of the supporting substrate 1. The surface of the supporting substrate 1 includes a flat surface $A_1$ and a curved surface $A_2$ that is positioned outwardly of, i.e. closer to the edge or perimeter $E_1$ of the flat surface $A_1$ which includes the perimeter part $E_1$ of the supporting substrate 1. A mark B indicates the boundary between the flat surface $A_1$ and the curved surface $A_2$. For ease of explanation, FIG. 1A shows X and directions, or coordinates which are parallel to the flat surface $A_1$ of the substrate and are perpendicular to each other, and Z direction or coordinate perpendicular to the flat surface $A_1$.

As also shown in FIG. 1, the semiconductor substrate 2 includes a first surface $S_1$ in which layers 11 (at least one layer 11 forming a semiconductor device) are formed, and a second surface $S_2$ forming the side opposite to, i.e. generally opposed and parallel to, the first surface $S_1$. In the present embodiment, the first surface $S_1$ and second surface $S_2$ respectively correspond to a front side and back side of the semiconductor substrate 2. The semiconductor substrate 2 is a silicon substrate, for example. Moreover, the layer 11 is an interlayer insulation film and includes at least a transistor and wiring. A reference number 12 indicates an electrode formed within the layer 11. The semiconductor substrate 2 and the surface of the supporting substrate 1 are secured together with an adhesive such that the first surface $S_1$ faces the supporting substrate 1 side. A mark $E_2$ indicates a position of the perimeter of the semiconductor substrate 2.

In the process of FIG. 1A, after the supporting substrate 1 and the semiconductor substrate 2 are secured together, the semiconductor substrate 2 is ground from the second surface $S_2$ side to thin the semiconductor substrate 2. Moreover, in the present embodiment, in order to prevent a crack of the semiconductor substrate 2 after the semiconductor substrate 2 is thinned, a grinding treatment that grinds the perimeter part $E_2$ of the semiconductor substrate 2 is performed beforehand thinning occurs. Therefore, the diameter of the semiconductor substrate 2 is smaller than the diameter of the supporting substrate 1, and the perimeter part $E_2$ of the semiconductor substrate 2 is positioned inside the perimeter part $E_1$ of the supporting substrate 1.

The adhesive 3 is applied to a region which, when the substrates 1 and 2 are joined, is between the supporting substrate 1 and the semiconductor substrate 2. However, in the present embodiment, in part because the diameter of the semiconductor substrate 2 is smaller than the diameter of the supporting substrate 1, a ledge or perimeter region of the joined substrates will have a portion of the adhesive thereon outside the perimeter part $E_2$ of the semiconductor substrate 2, which adhesive is also in contact with a side surface of the semiconductor substrate 2. Letter S indicates the adhesive 3 extending outwardly from the region between the supporting substrate 1 and the semiconductor substrate 2. Moreover, $E_3$ indicates a position of a perimeter part, i.e., the outward limit of extension from the edge or perimeter of the semiconductor substrate 2 of the adhesive 3. In FIG. 1A, the adhesive 3 spreads to the boundary line B of the flat surface $A_1$ and the curved surface $A_2$, although greater or lesser spreading may be encountered In addition, although the adhesive 3 extending outwardly from the above-mentioned region is in contact with an entire side surface of the semiconductor substrate 2 in FIG. 1A, as long as it is possible to exert sufficient adhesive strength between the semiconductor substrate 2 and supporting substrate 1, the adhesive 3 may be in contact with only a part of the side surface of the semiconductor substrate 2 or may not be in contact with the side surface of the semiconductor substrate 2.

Next, as illustrated in FIG. 1B, a protective film 4 is formed by chemical vapor deposition (CVD) so as to cover the second surface $S_2$ of the semiconductor substrate 2 and the exposed surface S of the adhesive 3 at regions S, and exposed portions of the surface and edge of the underlying supporting substrate 1.

The protective film 4 is an insulation film such as a silicon dioxide film and/or a silicon nitride film, etc., and protects the second surface $S_2$ of the semiconductor substrate 2 after it has been thinned. The protective film 4 may be a film other than an insulation film, or may be a lamination film in which two or more films are laminated. Moreover, the protective film 4 may be formed by a method other than CVD. A mark $E_4$ indicates a position of a perimeter part of the protective film 4. In FIG. 1B, the protective film 4 is continuously formed to the perimeter part $E_1$ of the supporting substrate 1, and thus extends over and covers the second surface $S_2$ of the substrate and all of the exposed region S of the adhesive, as well as exposed portions of the supporting substrate 1 on the surface thereof facing the semiconductor substrate 2.

Next, as illustrated in FIG. 1C, a resist film 5 is formed on the protective film 4. A mark $E_5$ indicates a position of a perimeter part of the resist film 5. In FIG. 1C, the resist film 5 is continuously formed to the perimeter part $E_1$ of the supporting substrate 1.

Figure 2A:
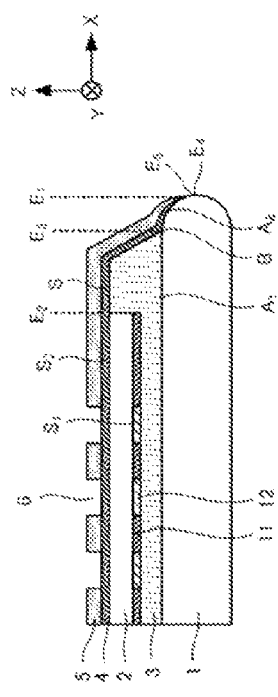
FIGS. 2A through 2C are cross-sectional views illustrating the manufacturing method of the semiconductor device according to the first embodiment.
Figure 2B:
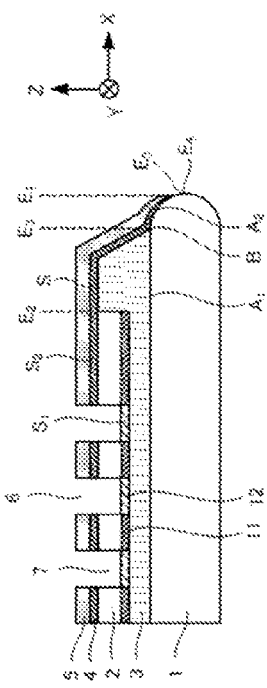
Figure 2C:
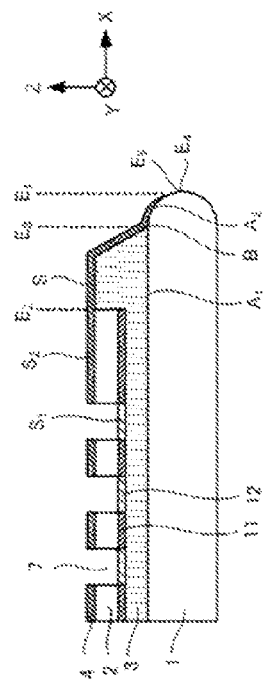

(2) Steps of FIG. 2A through FIG. 2C

Next, the method according to the first embodiment is explained with reference to FIGS. 2A through 2C.

Next, as illustrated in FIG. 2A, opening parts 6 corresponding to a TSV pattern are formed in the resist film 5. Next, by dry etching that uses the resist film 5 as a mask, penetration holes (TSV holes) 7 that penetrate the protective film 4 and the semiconductor substrate 2 and reach the electrode 12 are formed as shown in FIG. 2B. Next, as illustrated in FIG. 2C, the resist film 5 is removed (Note, FIG. 2A must be changed as marked up, it is currently incorrect).

Figure 4A:
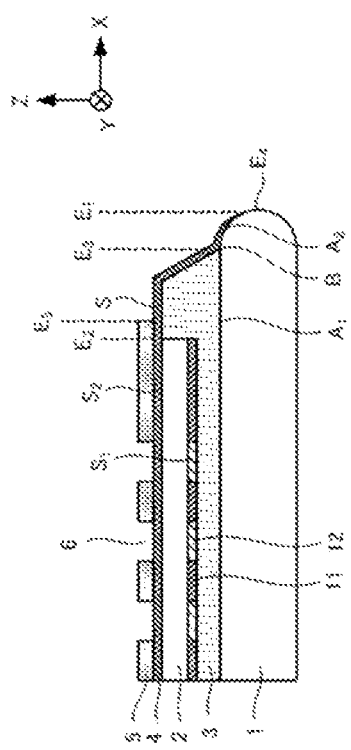
FIGS. 4A and 4B are cross-sectional views illustrating a manufacturing method of a semiconductor device according to a comparative example.
Figure 4B:
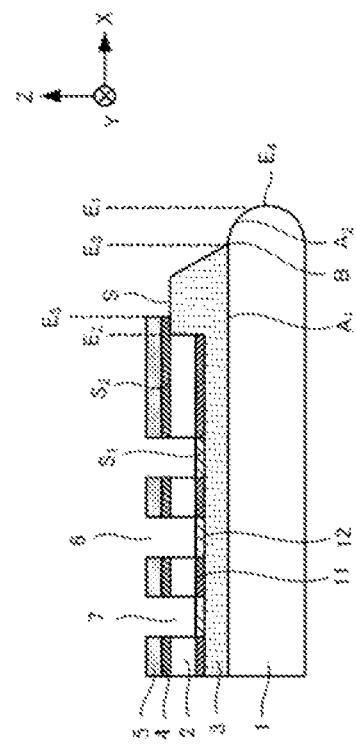

Here, in a general TSV electrode formation step, an edge cut treatment that removes certain region (for example, several millimeters) of the perimeter region of the resist film 5 is performed between the step of FIG. 1C and the step of FIG. 2B. In this edge cut treatment, (FIG. 4A is incorrect. See changes on the drawing.) the perimeter region of the resist film 5 is removed such that the perimeter part $E_5$ of the resist film 5 is positioned inside the perimeter part $E_3$ of the adhesive 3 (see FIG. 4A). FIGS. 4A and 4B are cross-sectional views illustrating a manufacture method of a semiconductor device of a comparative example. Therefore, when dry etching is performed by using the resist film 5 as a mask, the protective film 4 under the edge cut region is removed, and the adhesive 3 is exposed (see FIG. 4B). As a result, when the penetration holes 7 are formed, the exposed adhesive 3 absorbs etching gas and then releases the etching gas in a subsequent heating step (for example, a degasifying step after a barrier metal material that configures a part of an electrode material 9 is formed). It has been found out that the semiconductor substrate 2 separates easily from the supporting substrate 1 due to this.

On the other hand, in the present embodiment, the edge cut of the resist film 5 is not performed between the step of FIG. 1C and the step of FIG. 2B. Therefore, the step of FIG. 2B is performed in the state where the perimeter part $E_4$ of the protective film 4 and the perimeter part $E_5$ of the resist film 5 are outside the perimeter part $E_3$ of the adhesive 3. Therefore, even after the step of FIG. 2B, the adhesive 3 is not exposed, and the adhesive 3 remains being covered by the protective film 4 (see FIG. 2C). Therefore, according to the embodiment, it is possible to prevent the adhesive 3 from absorbing etching gas, and to suppress that the semiconductor substrate 2 separates from the supporting substrate 1.

In addition, in the present embodiment, the adhesive 3 spreads to the boundary line B of the flat surface $A_1$ and curved surface $A_2$ of the supporting substrate 1. Therefore, the step of FIG. 2B is performed in the state where the perimeter part $E_4$ of the protective film 4 and the perimeter part $E_5$ of the resist film 5 are outside the boundary line B. As a result, even after the step of FIG. 2B, the adhesive 3 is not exposed, and the adhesive 3 remains being covered by the protective film 4 (see FIG. 2C). In FIG. 2C, the perimeter part $E_4$ of the protective film 4 is positioned outside the boundary line B.

Figure 3A:
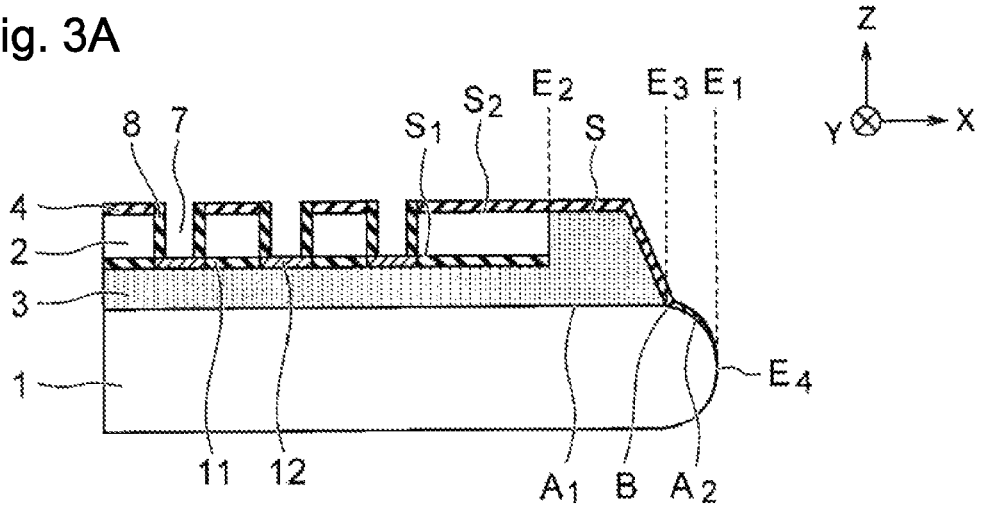
FIGS. 3A through 3C are cross-sectional views illustrating the manufacturing method of the semiconductor device according to the first embodiment.
Figure 3B:
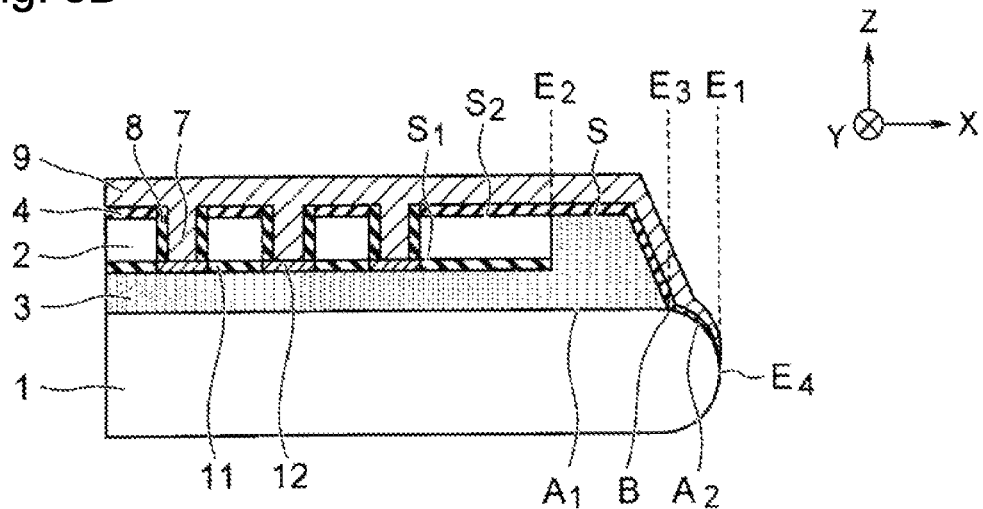
Figure 3C:
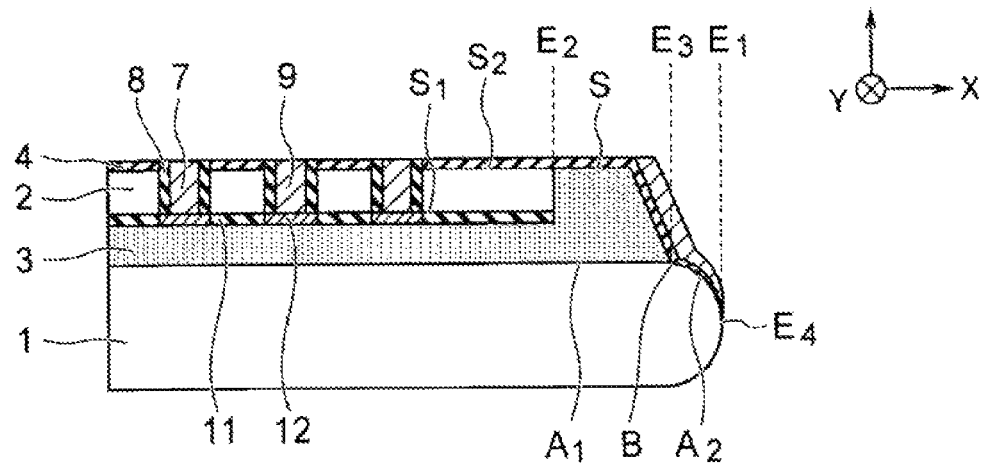

(3) Steps of FIG. 3A through FIG. 3C

Next, the method according to the first embodiment is explained with reference to FIGS. 3A through 3C.

Next, as illustrated in FIG. 3A, insulation films 8 are formed on side surfaces of the penetration holes 7. The insulation films 8 are formed by depositing an insulation film 8 by CVD and removing the insulation film 8 from the bottom surfaces of the penetration holes 7 and the upper surface of the protective film 4 by dry etching. In addition, depending on the forming condition of the insulation film 8, the insulation film 8 may remain on the upper surface of the protective film 4 after dry etching.

Next, as illustrated in FIG. 3B, an electrode material 9 is embedded in the penetration holes 7 such as by electroplating or vapor deposition techniques. As a result, the electrode material 9 is electrically connected with the electrodes 12 that form the bottoms of the penetration holes 7. In addition, the semiconductor substrate 2 and the electrode material 9 are mutually insulated from one another by the insulation films 8.

Next, as illustrated in FIG. 3C, the surface of the electrode material 9 is planarized by chemical mechanical polishing (CMP) until the protective film 4 is exposed, leaving penetration electrodes (TSV electrodes) 9 formed in the penetration holes 7. In addition, the word "TSV electrode" sometimes means an entire structure including the penetration electrode 9 and the electrode 12. Moreover, when the insulation film 8 remains on the upper surface of the protective film 4 after the dry etching of FIG. 3A, the CMP of FIG. 3C may be performed until the insulation film 8 is exposed, and the CMP may be performed until the protective film 4 is exposed by removing the insulation film 8.

Then, in the present method, the semiconductor substrate 2 is separated from the supporting substrate 1. In this way, the semiconductor substrate 2 that has the TSV electrode is manufactured.

In addition, the structure illustrated in FIG. 3B and FIG. 3C is an example of a semiconductor device that includes the supporting substrate 1, the semiconductor substrate 2 that is pasted to the surface of the supporting substrate 1 with the adhesive 3 such that the first surface $S_1$ faces the supporting substrate 1 side, the protective film 4 that is formed on the second surface $S_2$ of the semiconductor substrate 2 and on the surface S of the oozing adhesive 3 and has the perimeter part $E_4$ positioned outside the perimeter part $E_3$ of the adhesive 3, and the electrode material 9 formed so as to be embedded in the penetration holes 7 that penetrate the protective film 4 and the semiconductor substrate 2.

(4) Effect of First Embodiment

As described above, in the present embodiment, etching is performed to form the penetration holes 7 in the state where the perimeter $E_4$ of the protective film 4 and the perimeter $E_5$ of the resist film 5 extend beyond the perimeter part $E_3$ of the adhesive 3. Therefore, according to the present embodiment, the adhesive is protected from the etching gas and it is possible to prevent the adhesive 3 from absorbing etching gas and to suppress that the semiconductor substrate 2 separates from the supporting substrate 1.

In addition, the protective film 4 is preferably formed with a material through which etching gas does not permeate or is less likely to permeate. As an example of such material, a silicon dioxide film, a silicon nitride film, etc. are given. Therefore, the protective film 4 preferably includes at least one layer of silicon dioxide film or silicon nitride film.

Second Embodiment

FIGS. 5A through 6C are cross-sectional views illustrating a manufacture method of a semiconductor device of a second embodiment.

Figure 5A:
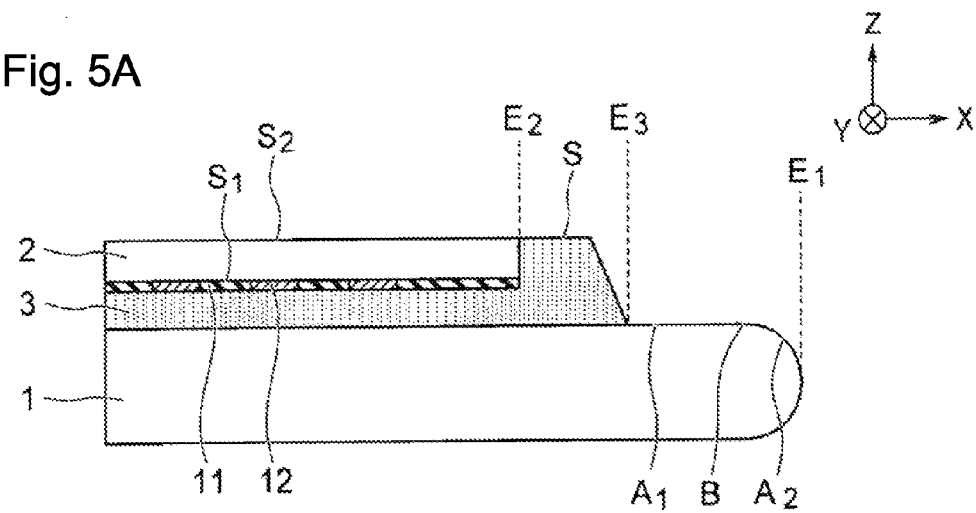
FIGS. 5A through 5C are cross-sectional views illustrating a manufacturing method of a semiconductor device according to a second embodiment.
Figure 5B:
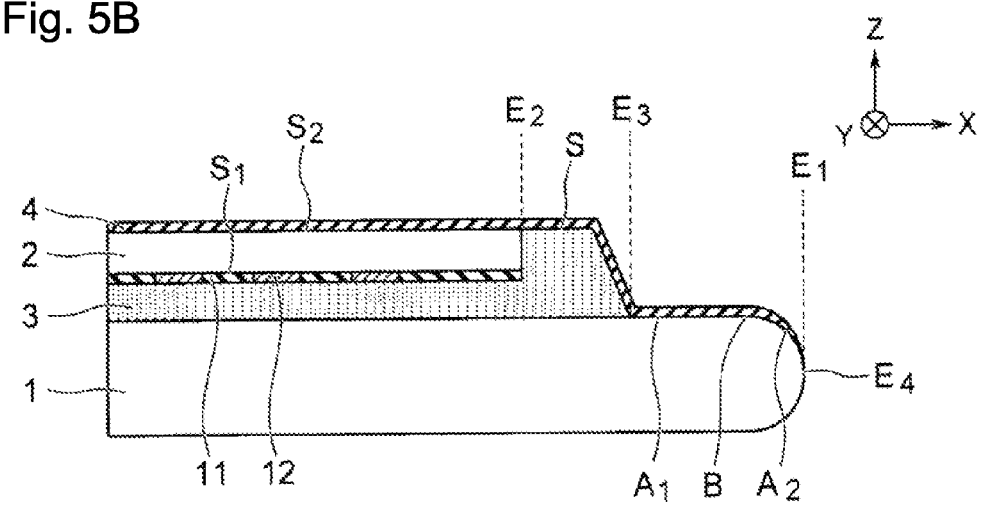

(1) Steps of FIG. 5A and FIG. 5B

In this method, first, as illustrated in FIG. 5A, the semiconductor substrate 2 is pasted to the surface of the supporting substrate 1 with the adhesive 3. In the present embodiment, an adjustment is performed to position the perimeter part $E_3$ of the adhesive 3 inside the boundary line B by adjusting an application position of the adhesive 3 and physically removing the adhesive 3 extending outwardly from position $E_3$ after the supporting substrate 1 and the semiconductor substrate 2 are pasted together. In addition, this adjustment may be performed by another method.

Next, as illustrated in FIG. 5B, the protective film 4 is formed so as to cover the second surface $S_2$ of the semiconductor substrate 2 and the surface S of the adhesive 3 extending outwardly from location $E_2$. In the present embodiment, because the perimeter part $E_3$ of the adhesive 3 is positioned inside the boundary B between the flat and rounded portions of the supporting substrate 1, a portion of the protective film 4 is formed directly on the flat surface $A_1$ of the supporting substrate 1 and is in contact with the flat surface $A_1$. Next, as shown in FIG. 5B, the protective film 4 is formed over the backside surface $S_2$ region S and the exposed supporting substrate surface to the perimeter part $E_1$ of the supporting substrate 1 as in FIG. 1B.

(2) Steps of FIG. 5C through FIG. 6B

Next, a method according to the second embodiment is explained with reference to FIG. 5A through FIG. 6B.

Figure 5C:
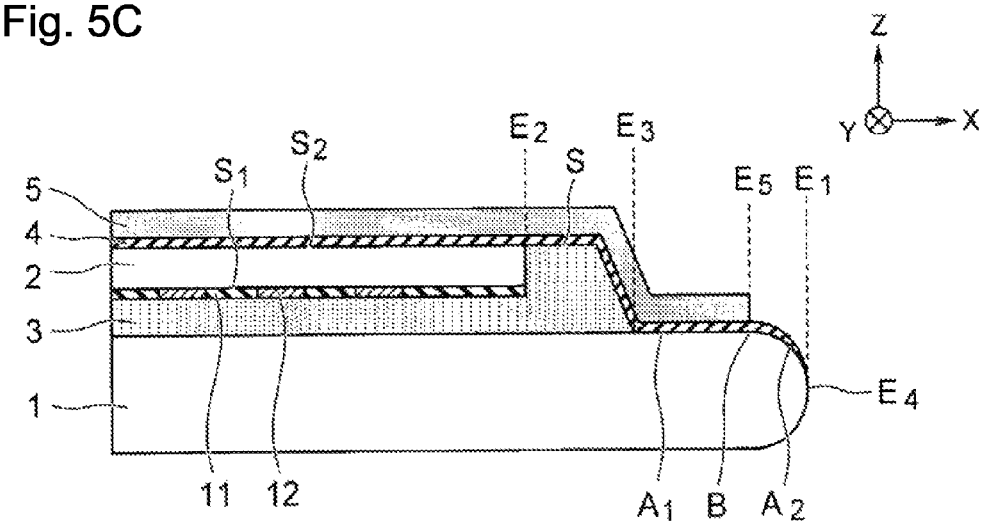
Figure 6A:
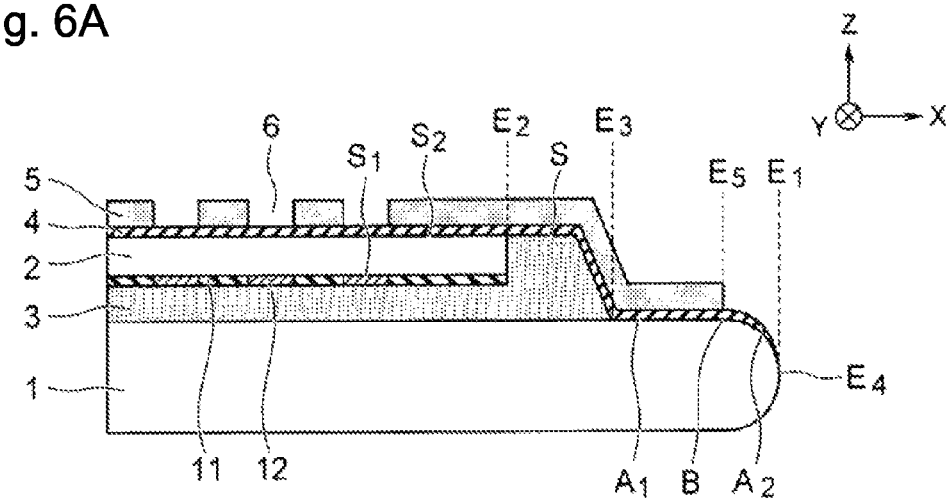
FIGS. 6A through 6C are cross-sectional views illustrating the manufacturing method of the semiconductor device according to the second embodiment.
Figure 6B:
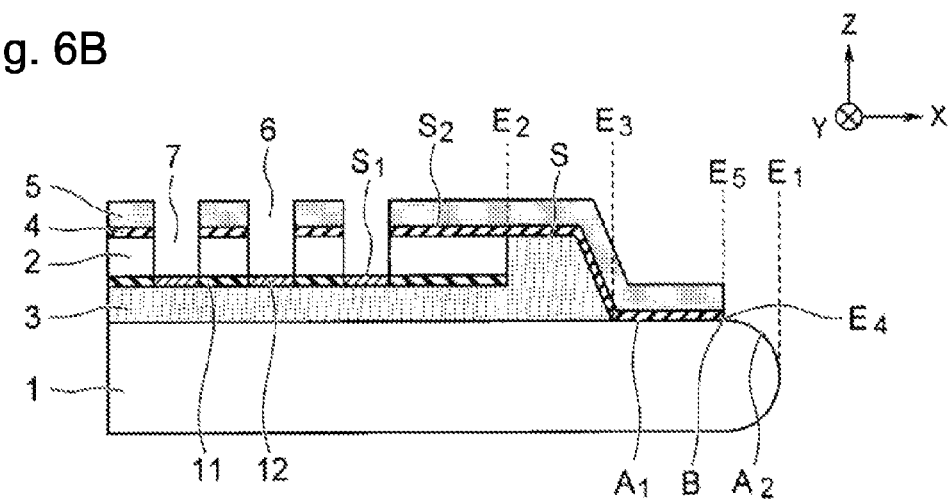

Next, as illustrated in FIG. 5C, the resist film 5 is formed on the protective film 4. Next, as illustrated in FIG. 6A, the opening parts 6 corresponding to the TSV pattern are formed in the resist film 5. Next, as illustrated in FIG. 6B, by dry etching using the resist film 5 as a mask, the penetration holes (TSV holes) 7 that penetrate the protective film 4 and the semiconductor substrate 2 and reach the electrodes 12 are formed. Then, the resist film 5 is removed.

Here, in the step of FIG. 5C, an edge cut treatment that removes certain region of a perimeter region of the resist film 5 is performed after an application of the resist film 5. However, in the edge cut treatment, the perimeter region of the resist film 5 is removed such that the perimeter part $E_5$ of the resist film 5 is positioned between the perimeter part $E_3$ of the adhesive 3 and the perimeter part $E_1$ of the supporting substrate 1. Therefore, the etching step of FIG. 6B is performed in the state where the perimeter part $E_4$ of the protective film 4 and the perimeter part $E_5$ of the resist film 5 are outside the perimeter part $E_3$ of the adhesive 3 as in the etching step of FIG. 2B. As a result, even after the step of FIG. 6B, the adhesive 3 is not exposed and remains being covered by the protective film 4. According to the present embodiment, it is possible to prevent the adhesive 3 from absorbing etching gas, and to suppress that the semiconductor substrate 2 separates from the supporting substrate 1.

It is possible to perform the edge cut of the resist film 5 with a chemical solution, exposure, etc. for example. In the latter case, an exposure treatment for the edge cut may be performed after the exposure treatment of FIG. 6A instead of performing it before the exposure treatment of FIG. 6A.

In the present embodiment, because the edge of the resist film 5 is cut, it is possible to prevent the resist film 5 from contacting component parts of a semiconductor manufacture apparatus when the supporting substrate 1 above which the resist film 5 is formed is carried. Such contact may generate contamination and particles. According to the present embodiment, it is possible to suppress the generation of contamination and particles by cutting the edge of the resist film 5 to such an extent that can prevent the above-described contact.

On the other hand, in the first embodiment, the resist film 5 and component parts of a semiconductor manufacture apparatus may contact each other. It is desirable to adopt the second embodiment in the case when generation of contamination and particles is an issue; but in contrast, it is desirable to adopt the method of the first embodiment in the case when generation of contamination and particles is not an issue, so that an edge cut treatment is omitted and the number of steps is reduced. In addition, when the first embodiment is adopted, such contact with the resist film 5 may be prevented by changing the design of a semiconductor manufacture apparatus, for example.

In addition, in the present embodiment, the perimeter part $E_5$ of the resist film 5 in FIG. 5C and the perimeter part $E_4$ of the protective film 4 in FIG. 6B are positioned at the boundary B between the flat and curved regions of the supporting substrate 1. However, these perimeter parts $E_4$ and $E_5$ may be positioned inside or outside the boundary B. Note, there is an advantage that it is generally more likely to prevent contact of the resist film 5 with component parts of a semiconductor manufacture apparatus when the perimeter part $E_5$ of the resist film 5 is positioned inside the boundary B rather than when the perimeter part $E_5$ is positioned outside the boundary B.

Moreover, in the present embodiment, in the case that an interval between the perimeter part $E_3$ and the perimeter part $E_1$ is narrow when the edge cut treatment is performed such that the perimeter part $E_5$ of the resist film 5 is positioned between the perimeter part $E_3$ of the adhesive 3 and the perimeter part $E_1$ of the supporting substrate 1, there is a threat that an edge of the resist film 5 inside the perimeter part $E_3$ may be accidentally cut. So, in the present embodiment, the interval between the perimeter part $E_3$ and the perimeter part $E_1$ is widened by positioning the perimeter part $E_3$ of the adhesive 3 inwardly of the boundary B, and thereby it is possible to avoid the above-described accidental edge cut.

(3) Steps after FIG. 6B

Steps after FIG. 6B are performed in the same way as the steps of FIG. 3A through FIG. 3C.

Figure 6C:
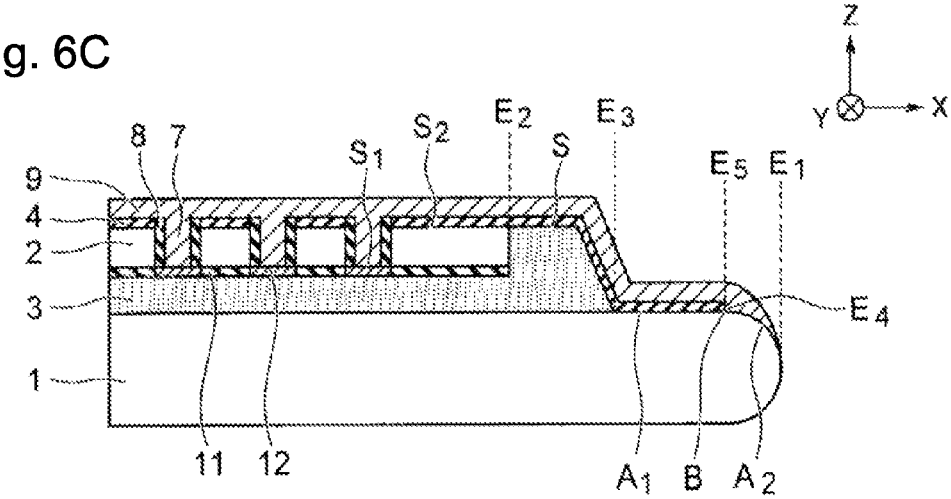

As in FIG. 3B, FIG. 6C illustrates the state where the insulation films 8 and the electrode material 9 are formed in the penetration holes 7. In the present embodiment, because the dry etching is performed by using the resist film 5 whose edge is cut as a mask, the protective film 4 under the edge cut region is removed, and the perimeter part $E_4$ of the protective film 4 is positioned inside the perimeter part $E_1$ of the supporting substrate 1 (FIG. 6C). Moreover, because the edge cut is performed such that the perimeter part $E_5$ of the resist film 5 is positioned outwardly of the perimeter part $E_3$ of the adhesive 3, the perimeter part $E_4$ of the protective film 4 is positioned outwardly of the perimeter part $E_3$ of the adhesive 3 (FIG. 6C).

After the vias have been filled with a conductor 9, and the conductor is polished off of the insulation layer 4, the semiconductor substrate 2 is separated from the supporting substrate 1. In this way, the semiconductor substrate 2 including the TSV electrode is manufactured.

In addition, the structure illustrated in FIG. 6C is an example of a semiconductor device that includes the supporting substrate 1, the semiconductor substrate 2 that is pasted to the surface of the supporting substrate 1 with the adhesive 3 such that the first surface $S_1$ faces the supporting substrate 1 side, the protective film 4 that is formed on the second surface $S_2$ of the semiconductor substrate 2 and on the surface S of the exposed adhesive 3, is positioned outside the parameter part $E_3$ of the adhesive 3, and has the perimeter part $E_4$ positioned inside the perimeter part $E_1$ of the supporting substrate 1, and the electrode material 9 formed so as to be embedded in the penetration holes 7 that penetrate the protective film 4 and the semiconductor substrate 2.

(4) Effects of Second Embodiment

At last, effects of the second embodiment are explained.

As described above, in the present embodiment, etching for forming the penetration holes 7 is performed in the state where the perimeter part $E_4$ of the protective film 4 and the perimeter part $E_5$ of the resist film 5 are positioned outwardly of the perimeter part $E_3$ of the adhesive 3. Therefore, according to the present embodiment, it is possible to prevent the adhesive 3 from absorbing etching gas and to suppress that the semiconductor substrate 2 separates from the supporting substrate 1.

Moreover, in the present embodiment, before the penetration holes 7 are formed, an edge cutting of the resist film 4 is performed such that the perimeter part $E_5$ of the resist film 5 is positioned between the perimeter part $E_3$ of the adhesive 3 and the perimeter part $E_1$ of the supporting substrate 1. Therefore, according to the present embodiment, contact of the resist film 5 with component parts of a semiconductor manufacture apparatus is prevented, so that it is possible to suppress generation of contamination and dust.

As described above, the first and second embodiments have been explained. While certain embodiments have been described, these embodiments have been presented by way of example only; and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirits of the inventions.

What is claimed is:

1. A semiconductor device, comprising:
a supporting substrate;
a semiconductor substrate having a first surface upon which one or more device layers are formed and a second surface opposed to said first surface;
an adhesive interposed between the supporting substrate and the semiconductor substrate, and forming an adhering layer to adhere the supporting substrate to the semiconductor substrate, wherein the first surface of the semiconductor substrate faces the supporting substrate, and the adhesive extends outwardly from the edge of the semiconductor substrate and exists on the surface of the support substrate adjacent to the edge of the semiconductor substrate; and
a protective film formed on the second surface of the semiconductor substrate and on a surface of the adhesive extending outwardly from the edge of the semiconductor substrate and existing on the surface of the support substrate adjacent to the edge of the semiconductor substrate, and
the protective film extending outwardly from the edge of the semiconductor substrate and terminating at a location that is located outwardly of the extent of the adhesive extending outwardly from the edge of the semiconductor substrate; and
an electrode material that is formed so as to be embedded in a penetration hole that penetrates the protective film and the semiconductor substrate through the second surface thereof.

2. The semiconductor device of claim 1, wherein the protective film comprises at least one of a silicon oxide layer and a silicon nitride film layer.

3. The semiconductor device of claim 1, wherein the adhesive extends outwardly from an edge of the semiconductor substrate to a position intermediate of adjacent edges of the semiconductor substrate and the supporting substrate.

4. The semiconductor device of claim 3, wherein the protective film extends to a position intermediate of the fully extended position of the adhesive from the edge of the semiconductor substrate and the edge of the supporting substrate.

5. The semiconductor device of claim 1, wherein the penetration hole extends through the protective film and at least a portion of the semiconductor substrate.

6. The semiconductor device of claim 5, wherein the protective film protects the adhesive from exposure to an etching material used to form the penetration hole.

7. The semiconductor device of claim 6, wherein a portion of the protective film is removed from the supporting substrate at a position outwardly of the position where the adhesive extends outwardly from an edge of the semiconductor substrate to a position intermediate of the edge of the semiconductor substrate and the edge of the supporting substrate.

8. The semiconductor device of claim 3, wherein the supporting substrate includes a flat surface terminating in a curved surface with a boundary therebetween, and the adhesive extends outwardly from the semiconductor substrate over the flat surface but does not extend onto the curved surface of the supporting substrate, and the protective film extends over the substrate, the exposed adhesive and at least a portion of the curved surface of the supporting substrate.

9. The semiconductor device of claim 8, wherein a portion of the protective film extending over the substrate, the exposed adhesive and at least a portion of the curved surface of the supporting substrate is removed without exposing the underlying substrate or adhesive.

10. The semiconductor device of claim 9, wherein opening parts of the protective film are formed by using a resist film as a mask.

11. A manufacturing method of a semiconductor device, comprising the steps of:
adhering a semiconductor substrate to a surface of a supporting substrate with adhesive such that a first surface of the semiconductor substrate faces the supporting substrate and at least a portion of the adhesive is located on the supporting substrate and is not overlaid by the semiconductor substrate;
thinning the semiconductor substrate by grinding the semiconductor substrate from a second surface side;
forming a protective film that covers the second surface of the semiconductor substrate and the surface of the adhesive extending outwardly from a region between the supporting substrate and the semiconductor substrate;
forming a resist film on the protective film;
forming a penetration hole that penetrates the protective film and the semiconductor substrate by using the resist film as a mask in a state where the protective film and the resist film cover the adhesive which is not overlaid by the semiconductor substrate and the protective film contacts portions of the supporting substrate that are not overlaid with the semiconductor substrate or the adhesive; and
forming an electrode material in the penetration hole.

12. The manufacturing method according to claim 11, further including the step of removing the resist film from at least a portion of the surface of the supporting substrate such that the perimeter of the resist film is positioned between a perimeter of a adhesive and a perimeter of the supporting substrate.

13. The manufacturing method according to claim 11, wherein the step of forming the penetration hole includes the step of etching the penetration hole in a plasma etch chemistry.

14. The manufacturing method of claim 11, wherein the step of forming an electrode material includes the step of electroplating a conductor at least within the penetration holes.

15. The manufacturing method of claim 11, wherein the supporting substrate includes a flat surface and a curved surface, and the adhesive extends from the edge of the semiconductor substrate no further than the boundary of the curved and edge portions.

16. The manufacturing method of claim 15, wherein the step of forming the protective layer deposits a protective layer over the semiconductor substrate, the exposed adhesive on the flat portion of the supporting substrate and at least a portion of the curved portion of the supporting substrate.

17. The manufacturing method of claim 16, further including the step of removing a portion of the perimeter of the semiconductor substrate prior to adhering the semiconductor substrate to the supporting substrate.

18. The manufacturing method of claim 16, further including the step of separating the semiconductor substrate from the supporting substrate.

19. The manufacturing method of claim 16, wherein the step of forming an electrode in the penetration hole includes the steps of depositing a metal into the penetration holes and over the protective film, and, polishing the metal off of the protective film.

20. A device substrate and supporting substrate assembly for forming a through silicon via into the non-device side of a device substrate, comprising;
a supporting substrate;
a device substrate having a dimension smaller than the supporting substrate;
an adhesive extending between the supporting substrate and the device substrate and further extending outwardly from at least a portion of the perimeter of the device substrate on a surface of the supporting substrate; and
a protective film extending outwardly from the edge of the device substrate over the adhesive on the surface of the supporting substrate and on at least a portion of the supporting substrate which is not covered by the adhesive.

* * * * *